United States Patent [19]
Anhalt et al.

[11] 4,008,938
[45] Feb. 22, 1977

[54] ELECTRICAL CONNECTOR

[75] Inventors: John W. Anhalt; David S. Goodman, both of Orange, Calif.; Leland W. Oliver, Scottsdale, Ariz.

[73] Assignee: International Telephone and Telegraph Corporation, New York, N.Y.

[22] Filed: Aug. 11, 1975

[21] Appl. No.: 603,752

[52] U.S. Cl. .................. 339/17 CF; 39/17 LM; 339/174

[51] Int. Cl.² ........................................ H05K 1/07

[58] Field of Search .......... 339/17 F, 17 CF, 17 L, 339/17 LC, 17 LM, 17 M, 59 R, 59 M, 61 R, 61 M, 174

[56]  References Cited
UNITED STATES PATENTS

| | | | |
|---|---|---|---|
| 3,173,732 | 3/1965 | James | 339/17 LM |
| 3,522,652 | 8/1970 | Gordon | 339/17 F |
| 3,579,206 | 5/1971 | Grange | 339/17 F |
| 3,609,463 | 9/1971 | Laboue | 339/17 LM |
| 3,960,424 | 6/1976 | Weisenburger | 339/17 M |

*Primary Examiner*—Roy Lake
*Assistant Examiner*—Mark S. Bicks
*Attorney, Agent, or Firm*—Thomas L. Peterson

[57]  ABSTRACT

An electrical connector for interconnecting conductive traces on a pair of electronic components, such as a display panel and logic circuit used in a digital wristwatch. The connector comprises an elongated insulative member having a flexible dielectric tape mounted on one side. A plurality of spring conductive strips are bonded on said tape. The strips have upper and lower portions which interconnect the traces on the electronic components.

5 Claims, 4 Drawing Figures

FIG.I.

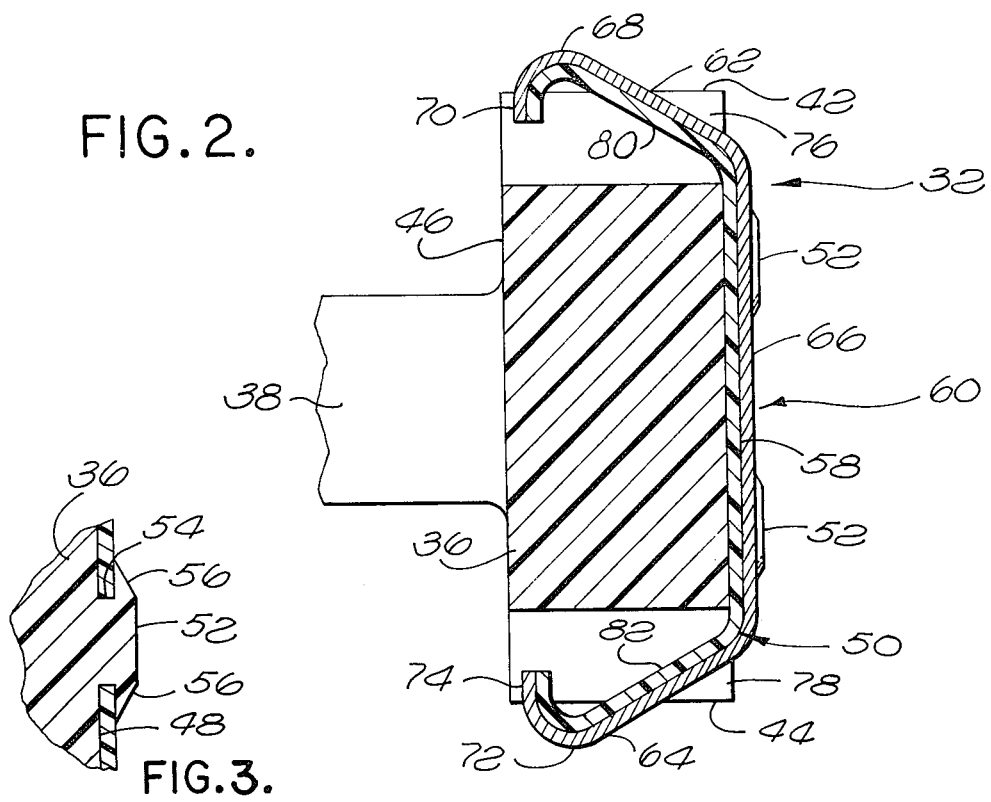
FIG.2.
FIG.3.
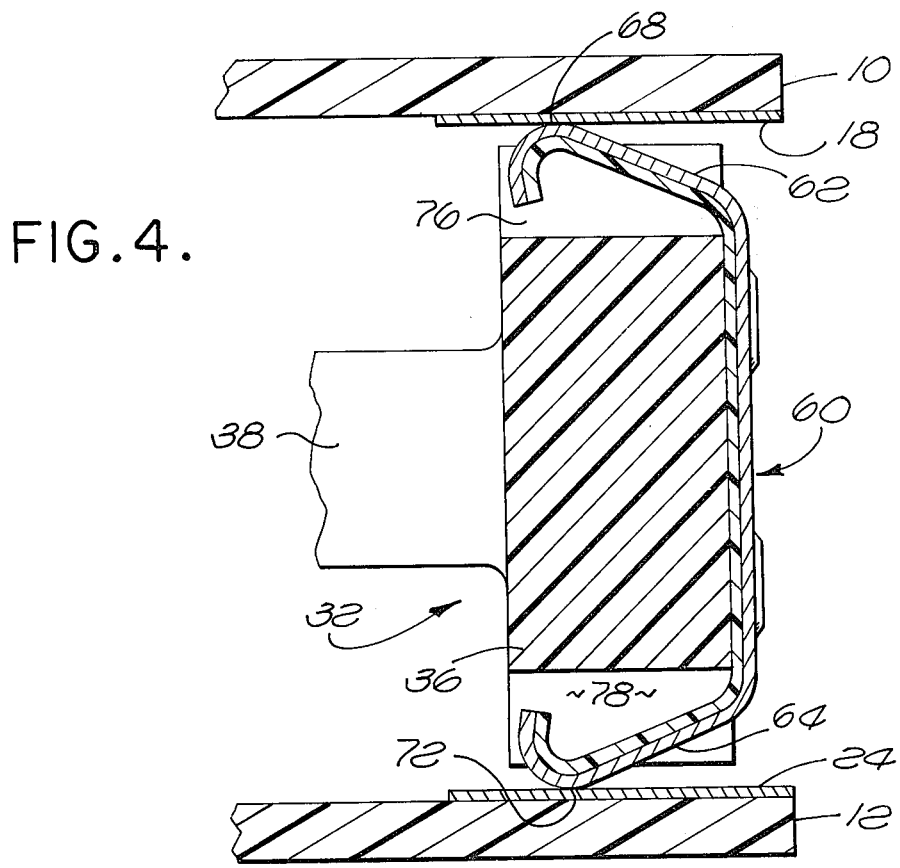
FIG.4.

ELECTRICAL CONNECTOR

CROSS REFERENCE TO RELATED APPLICATION

This application discloses an invention which is related to the invention disclosed in copending application of Anhalt et al entitled, "Electrical Connector", Ser. No. 549,774, filed Feb. 13, 1975, assigned to the assignee of the present application.

BACKGROUND OF THE INVENTION

This invention relates generally to an electrical connector and, more particularly, to an electrical connector for interconnecting conductive traces on a pair of electronic components.

Electronic systems such as computers and calculators commonly utilize alpha numerical dislay panels. The more frequently used display panels are the light emitting diode, the liquid crystal display and the gas discharge types. All of these types of displays utilize a similar method of connecting to the logic circuit in the electronic system. Conductive traces leading from each display are bonded to traces on the logic circuit by means of dots of conductive epoxy. The dots of conductive epoxy are placed on the traces on the logic circuit by hand by the use of a hypodermic needle. The display panel is then placed over the logic circuit with the traces thereon engaging the dots of the conductive epoxy. Needless to say, this technique of electrically connecting the conductive traces on the display panel and logic circuit is very time consumming. Furthermore, this interconnection arrangement provides a somewhat permanent assembly, making it generally impractical for replacement of either the display panel or the logic circuit in the field. As a consequence, the electronic system normally has to be returned to the factory for repair.

With the advent of microdisplays used in miniature computers and digital wristwatches, the problem of interconnecting the display panels to the logic circuits has become acute. The use of conductive epoxy dots to interconnect the traces on the electronic components is frequently impractical since sometimes adjacent dots come into contact causing a short circuit. While electrical connecting devices are available for this application, their sizes are of major design concern particularly in such small devices as digital wristwatches. In addition, such devices frequently damage the conductive traces on the display panel during mating of the electronic components by the connector.

It is known in the art that conductive elastomers may be utilized for performing electrical interconnections, such as for interconnecting an IC to a printed circuit board. The disadvantage of conductive elastomers is high long term compression set which is caused by the massive fillers required to achieve conductivity in the elastomers. Therefore, these conductive elastomer connectors are not entirely suitable for use in interconnecting display panels to logic circuits in miniature devices. Also conductivity of conductive elastomers is poor resulting in restricted circuit applications.

The aforementioned copending application Ser. No. 549,774 discloses a connector which comprises basically an elongated nonconductive elastomeric member having spaced conductive coatings thereon extending to the upper and lower surfaces of the elastomeric member for interconnecting the traces on the electronic components. Such connector overcomes the disadvantages of the prior art electrical interconnection arrangements since it is separable from the electronic components that it is interconnecting, thus allowing replacement of the components in the field. The connector may be made sufficiently small for use in miniature systems, it will not cause damage to the traces on the electronic components and is not subject to high long term compression set. It is the purpose of the present invention to provide another form of electrical connector having the aforementioned advantages.

SUMMARY OF THE INVENTION

According to the principal aspect of the present invention, there is provided an electrical connector member for interconnecting rows of conductive traces on a pair of electronic components, such as a display panel and logic circuit utilized in a miniature electronic device like a computer, calculator or digital wristwatch. The connector comprises an insulative member having upper and lower surfaces. A flexible dielectric tape is mounted on one side of the insulative member. A plurality of vertically extending, spaced spring conductive strips are bonded to the outer surface of the tape. The spacing of the strips corresponds to the spacing of the conductive traces on the electronic components. Each conductive strip has an upper portion and a lower portion. The upper portion extends above the upper surface and the lower portion extends below the lower surface of the insulative member for making wiping engagement with the conductive traces on the two electronic components, thereby electrically interconnecting the traces on the components. The connector is simple in construction, inexpensive to manufacture and provides a termporary rather than a permanent electrical connection between the electronic components thereby allowing servicing of the device employing the connector in the field. The connector may be made very small so as to be practically utilized in miniature electronic devices. Moreover, the connector is not subject to high long-term compression set as are conductor-filled elastomer-type connectors. Other aspects and advantages of the invention will become more apparent from the following description taken in connection with the accompanying drawings.

BRIEF DESCRIPTION OF THE DRAWINGS

FIG. 2 is an enlarged vertical sectional view taken along line 2—2 of FIG. 1 showing one of the connector members utilized in the assembly illustrated in FIG. 1;

FIG. 3 is a fragmentary vertical section taken along line 3—3 of FIG. 1 a retention hub or rivet used on the connector member; and FIG. 4 is a vertical sectional view similar to FIG. 2 but showing the connector member interconnecting the traces on the two electronic components illustrated in FIG. 1.

DESCRIPTION OF THE PREFERRED EMBODIMENTS

Figure 1:
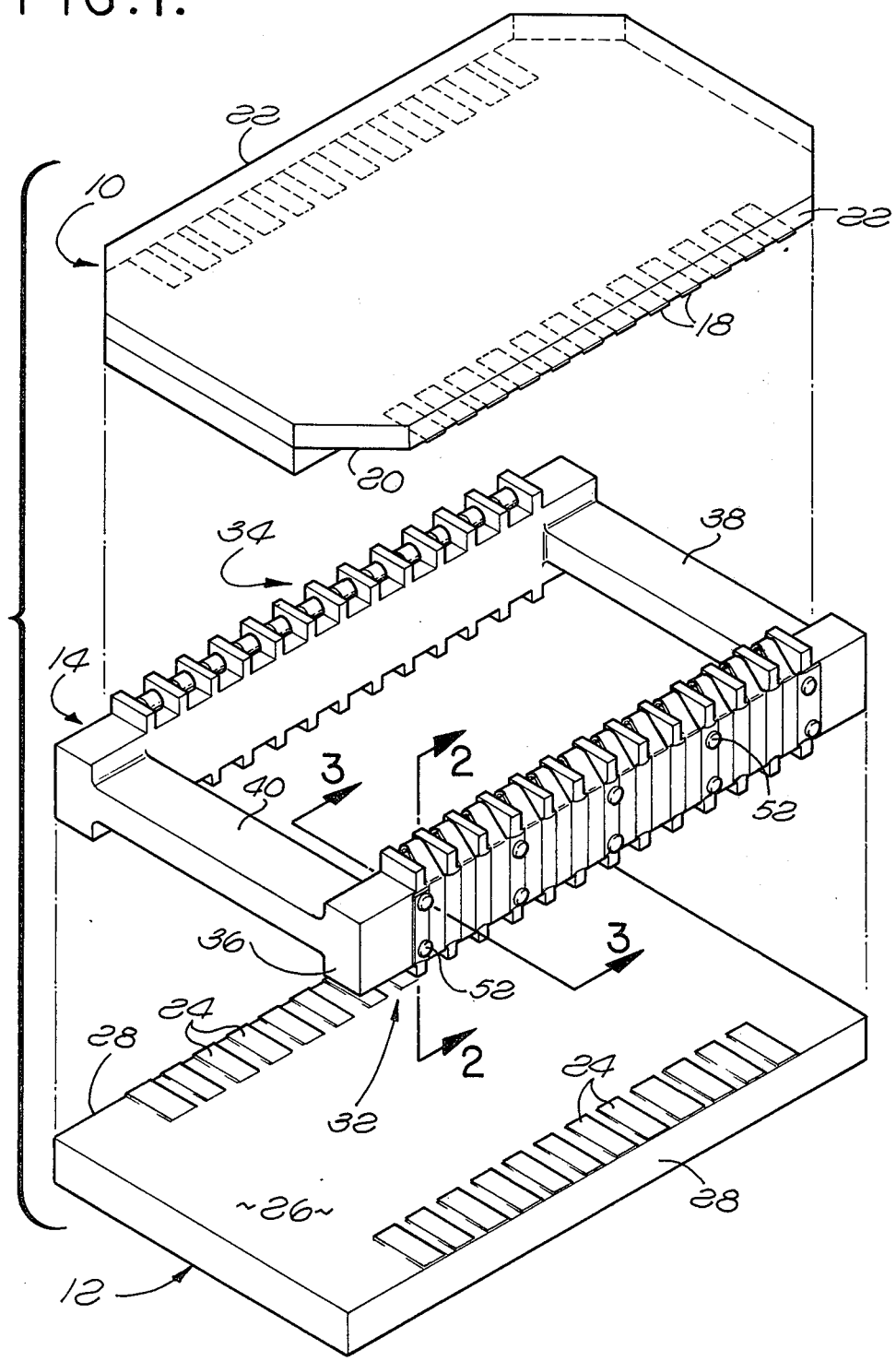
FIG. 1 is an enlarged, perspective exploded view of various parts of an electronic device including a pair of electronic components, and a connector assembly constructed in accordance with the present invention for interconnecting the components.

Referring now to FIG. 1 of the drawings in detail, there is illustrated a pair of electronic components 10 and 12 and a connector assembly 14 in accordance with the present invention positioned between the components. The connector assembly may be mounted in a carrier, not shown, which is a part of a housing of a digital wristwatch. It will be understood, however, that the connector assembly 14 may be mounted in any miniaturized electronic device, such as a computer or calculator, requiring interconnection between the components 10 and 12. The component 10 may be any form of a display panel such as already mentioned herein. The display panel has two rows of spaced conductive traces 18 on its lower surface 20 adjacent to the sides 22 of the panel. The electronic component 12 is a logic element such as an integrated circuit or chip. It will be appreciated however that the logic element could also be a PC board, for example, if the system is a computer or calculator. Two rows of conductive traces 24 are formed on the upper surface 26 of the logic element 12 along the sides 28 thereof. The distance between the rows of traces 18 and 24 is substantially the same, and the individual traces in each row are spaced apart a corresponding distance so that when the display panel 10 is mounted in alignment over the logic element 12 the respective traces on the two components will be in alignment and will face each other.

The connector assembly 14 comprises a pair of connector members 32 and 34 which are identical and therefore only one connector member 32 will be described herein. The connector member 32 comprises a relatively rigid, elongated, insulative member 36. The ends of the respective insulative members 36 of the two connector members 32, 34 are joined by end pieces 38 and 40, providing an integral rectangular frame-like connector assembly which may be mounted as a unit within a suitable carrier. It will be appreciated however that if the electronic components 10 and 12 have only a single row of traces thereon, then only one connector member 32 or 34 would be required for providing electrical interconnection therebetween.

The insulative member 36 has an upper surface 42, a lower surface 44 and a pair of spaced parallel sides 46 and 48 interconnecting the upper and lower surfaces. An elongated relatively thin flexible dielectric tape 50 is mounted lengthwise on the side 48 of member 36. The tape may be formed of a suitable synthetic resin polymer, such as Teflon. The tape may be secured to member 36 by cement bonding or by the use of thermal riveting, as shown. The thermal riveting is achieved by providing outwardly extending retaining hubs 52 on the member 36 which extend through corresponding openings 54 in the tape 50. The ends of the hubs 52 are heated and compressed to form annular flanges 56 which extend over the outer surface 58 of the tape.

A plurality of vertically extending, parallel, spaced spring conductive strips 60 are bonded to the outer surface 58 of the dielectric tape. The spacing of the strips 60 corresponds to the spacing of the conductive traces 18 and 24 on the electronic components 10 and 12, respectively. Each conductive strip 60 includes an upper portion 62, a lower portion 64, and an intermediate section 66 which connect the upper and lower portions of the strip. The upper portion of the strip is bent upwardly and inwardly from the side 48 of the insulative member 36 and is formed with an upwardly curved contacting section 68 which extends above the upper surface 42 of the member 36. The end 70 of the upper portion 62 of the strip extends vertically downwardly as best seen in FIG. 2. The lower portion 64 of the conductive strip is bent downwardly and inwardly from the side 48 and likewise is formed with a curved contacting section 72 which extends below the lower surface 44 of member 36. The end 74 of the lower portion 64 of conductive strip 60 extends vertically upwardly. Transversely extending slots 76 and 78 are formed in the upper and lower surfaces of the insulative member 36. The conductive strips are aligned with these slots and extend partially thereinto as seen in FIG. 2. The slots receiving the conductive strips serve to electrically isolate adjacent strips and also limit the amount of deflection of the upper and lower bent portions of the strips when the connector member 32 is positioned between the components 10 and 12 for interconnecting the conductive traces thereon.

The dielectric tape 50 is formed with upper and lower rows of spaced, vertically extending, parallel fingers 80 and 82, respectively, which underly the upper portions 62 and lower portions 64 of the conductive strips. These fingers are bonded to the strips as the main body portion of the dielectric tape 50 is bonded to the intermediate section 66 of the conductive strips. The fingers 80 and 82 are not necessary to the operation of the connector, but result from the preferred method utilized to produce the tape with conductive strips 60 thereon, which will be described later herein.

FIG. 3 illustrates how the connector member 32 provides electrical connection between the traces 18 and 24 when the connector assembly 14 is sandwiched between the components 10 and 12. Normally, there will be a slight vertical compressive force when the three parts are assembled together in a suitable casing so that the upper and lower portions of the conductive strips 60 on the dielectric tape 50 are deflected vertically. The vertical deflection of the upper and lower portions of the conductive strips into the respective slots 76 and 78 in insulative member 36 causes the curved contacting sections 68 and 72 to move in an arc producing a slight low force wiping action between the strips and the traces on the components 10 and 12 which assures a positive electrical connection with a minimum wear of the traces.

The dielectric tape 50 with the conductive strips 60 thereon is produced by utilizing the well-known technology employed in the production of flex circuits and flat cables. A plurality of elongated, thin parallel conductive strips, such as spring tempered copper alloy, are placed lengthwise on one surface of a flat elongated dielectric tape and bonded thereto. The tape is then cut transversely into suitable short lengths providing generally rectangular sections with spaced conductive strips on one side which extend to the upper and lower ends of each section. The portions of each tape section between the upper and lower ends of the conductive strips are then removed and the strips are then formed or bent into the configuration illustrated in the drawings. It will be readily appreciated that the resultant dielectric tape 50 with the conductive strips 60 thereon may be readily manufactured at very low cost by mass production techniques. Further, it is seen that the conductive strips or contact elements 60 of the connector member 32 may be easily and simultaneously mounted on the insulative member 36 by simply mounting the single dielectric tape 50 thereto.

It is further appreciated that the connector of the present invention has the advantage over conductor filled elastomers in that it is not subject to high long-term compression set resulting in loss of electrical contact as sometimes occurs with filled elastomers. The resilient conductive strips 60 on the tape 50 retain their spring action even after long periods of use thereby assuring good electrical contact with the elements being electrically interconnected. In addition, the connector member 32 is very thin and takes up only a very small amount of space in the assembly in which it is utilized. Obviously, the time for mounting the connector assembly 14 in a casing to electrically interconnect the components 10 and 12 is many times less than that required to interconnect the components by the use of dots of conductive epoxy using a hypodermic needle as is the conventional practice now. Therefore, the connector of the present invention is much less expensive to utilize. It also has the advantage that it does not provide a permanent assembly requiring return of the system to the factory for repair.

We claim:

1. An electrical connector member for interconnecting a first electronic component having a first row of spaced conductive traces on the lower surface thereof with a second electronic component having a second row of spaced conductive traces on the upper surface thereof aligned with said first row of conductive traces comprising:

an insulative member having upper and lower surfaces and a vertically extending side therebetween;
a flexible dielectric tape mounted on said side, said tape having an outer surface opposite to said side;
a plurality of vertically extending, parallel, spaced, continuous spring conductive strips bonded to said outer surface; and
each said strip having an upper flexible free end portion and a lower flexible free end portion, said upper end portion being spaced above said upper surface and said lower end portion being spaced below said lower surface for resiliently interconnecting said traces.

2. An electrical connector member as set forth in claim 1 wherein:

said tape underlies said upper and lower end portions of said strips.

3. An electrical connector member as set forth in claim 2 wherein:

said tape includes upper and lower rows of spaced, vertically extending, parallel fingers underlying said upper and lower end portions, respectively, of said strips.

4. An electrical connector member as set forth in claim 1 including:

transversely extending, spaced slots in said upper and lower surfaces of said insulative member, said slots being aligned with and receiving parts of said upper and lower end portions, respectively, of said strips.

5. An electrical connector member for interconnecting a first electronic component having a first row of spaced conductive traces on the lower surface thereof with a second electronic component having a second row of spaced conductive traces on the upper surface thereof aligned with said first row of conductive traces comprising:

an insulative member having upper and lower surfaces and a vertically extending side therebetween;
a flexible dielectric tape mounted on said side, said tape having an outer surface opposite to said side;
a plurality of vertically extending, parallel, spaced, continuous spring conductive strips bonded to said outer surface; and
each said strip having an upper flexible end portion and a lower flexible end portion, said upper end portion having a contacting section spaced above said upper surface and movable relative thereto and said lower end portion having a contacting section spaced below said lower surface and movable relative thereto for resiliently interconnecting said traces, the inherent resiliency of said spring conductive strips being the sole means for imparting spring action to said strips.

* * * * *